(12) United States Patent
Inatomi et al.

(10) Patent No.: US 10,179,950 B2
(45) Date of Patent: Jan. 15, 2019

(54) PLATING METHOD, PLATED COMPONENT, AND PLATING SYSTEM

(71) Applicant: TOKYO ELECTRON LIMITED, Tokyo (JP)

(72) Inventors: Yuichiro Inatomi, Nirasaki (JP); Takashi Tanaka, Nirasaki (JP); Nobutaka Mizutani, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 18 days.

(21) Appl. No.: 15/184,215

(22) Filed: Jun. 16, 2016

(65) Prior Publication Data
US 2016/0372367 A1 Dec. 22, 2016

(30) Foreign Application Priority Data
Jun. 19, 2015 (JP) .................. 2015-123584

(51) Int. Cl.
*C23C 18/50* (2006.01)
*C23C 18/38* (2006.01)
(Continued)

(52) U.S. Cl.
CPC .......... *C23C 18/50* (2013.01); *C23C 18/1651* (2013.01); *C23C 18/32* (2013.01);
(Continued)

(58) Field of Classification Search
CPC ......... H01L 21/76874; H01L 21/76879; H01L 21/76867; H01L 23/53238; H01L 23/528; H01L 23/5226; C23C 18/50; C23C 18/38
See application file for complete search history.

(56) References Cited

U.S. PATENT DOCUMENTS

2006/0070769 A1* 4/2006 Kim ................. H05K 3/421
  174/262
2009/0108455 A1* 4/2009 Gurumurthy ......... H01L 21/288
  257/762
(Continued)

FOREIGN PATENT DOCUMENTS

JP 2002-093747 A 3/2002
JP 2002-275639 A 9/2002
(Continued)

OTHER PUBLICATIONS

Shacham-Diamand et al., ("Electroless processes for micro- and nanoelectronics"), Electrochimica Acta 48 (2003) 2987-2996.*

*Primary Examiner* — A. Sefer
(74) *Attorney, Agent, or Firm* — Pearne & Gordon LLP

(57) ABSTRACT

Reliability of a plating process and reliability of a component manufactured through the plating process can be improved by suppressing peeling between plating layers formed by electroless plating. In a plating method, a plated component manufactured by the plating method, and a plating system 1 configured to manufacture the plated component by the plating method, a second electroless plating layer 39, which is made of a copper alloy and formed by the electroless plating, is formed on a surface of a first electroless plating layer 38 formed by the electroless plating. The first electroless plating layer 38 is a barrier layer configured to suppress diffusion of copper and is made of cobalt or a cobalt alloy. The second electroless plating layer 39 is a seed layer for forming an electrolytic plating layer of copper on a surface thereof and is made of an alloy of copper and nickel.

7 Claims, 2 Drawing Sheets

(51) Int. Cl.
*C23C 18/16* (2006.01)
*C23C 18/32* (2006.01)
*H01L 21/768* (2006.01)
*H01L 21/288* (2006.01)
*C23C 18/18* (2006.01)

(52) U.S. Cl.
CPC ............ *C23C 18/38* (2013.01); *H01L 21/288* (2013.01); *H01L 21/76873* (2013.01); *H01L 21/76898* (2013.01); *C23C 18/1653* (2013.01); *C23C 18/1893* (2013.01); *H01L 21/76843* (2013.01); *H01L 2221/1089* (2013.01)

(56) References Cited

U.S. PATENT DOCUMENTS

| | | | |
|---|---|---|---|
| 2014/0131875 A1* | 5/2014 | Haba | H01L 23/49833 257/762 |
| 2014/0232013 A1 | 8/2014 | Wu | |
| 2015/0030774 A1* | 1/2015 | Tanaka | C23C 18/1651 427/294 |
| 2017/0077037 A1* | 3/2017 | Kelly | H01L 23/53238 |

FOREIGN PATENT DOCUMENTS

| | | | |
|---|---|---|---|
| JP | 2005-528776 A | | 9/2005 |
| JP | 2010185113 A | | 8/2010 |
| JP | 2013-530311 A | | 7/2013 |
| JP | 2013-194306 | * | 9/2013 |
| WO | 03/028090 A2 | | 4/2003 |
| WO | 2012/004710 A2 | | 1/2012 |

\* cited by examiner

PLATING METHOD, PLATED COMPONENT, AND PLATING SYSTEM

CROSS-REFERENCE TO RELATED APPLICATION

This application claims the benefit of Japanese Patent Application No. 2015-123584 filed on Jun. 19, 2015, the entire disclosures of which are incorporated herein by reference.

TECHNICAL FIELD

The embodiments described herein pertain generally to a plating method, a plated component manufactured according to the plating method, and a plating system configured to manufacture the plated component according to the plating method.

BACKGROUND

With a trend of miniaturization and multifunctionality of electronic devices, a circuit formed within a semiconductor component needs to be highly densified and operated at a high speed. To this end, in a silicon substrate used as the semiconductor component, for example, multiple layers of circuit boards are stacked on top of each other, and the individual layers are connected by a silicon-through electrode. Copper, which has low electrical resistance and high reliability, is used as the silicon-through electrode.

To form the silicon-through electrode made of copper in the silicon substrate, various kinds of plating processes are performed on a surface of a recess formed in the silicon substrate. First, by electrolessly plating cobalt/tungsten/boron (Co—W—B) on the surface of the recess formed in the silicon substrate, a barrier layer for suppressing diffusion of copper is formed. Then, by electrolessly plating copper on a surface of the barrier layer, a seed layer composed of a single film of the copper is formed. Thereafter, copper is electroplated on a surface of the seed layer made of the copper, so that the copper is buried in the recess formed in the silicon substrate.

Patent Document 1: Japanese Patent Laid-open Publication No. 2010-185113

In the aforementioned conventional plating process, however, it is observed that the barrier layer is peeled off from the silicon substrate when forming the seed layer made of the single film of copper on the surface of the barrier layer. Further, in the aforementioned conventional plating process, it is also observed that the silicon-through electrode (barrier layer, seed layer and buried copper) is peeled off from the surface of the silicon substrate after the silicon-through electrode is formed.

As stated above, if the single film of copper is electrolessly plated on the surface of the film which is formed by the electroless plating, the peeling between the films may occur, so that the reliability of the plating process and the reliability of the component manufactured through the plating process are deteriorated.

SUMMARY

In one exemplary embodiment, a plating method includes forming, by electroless plating, a second electroless plating layer made of a copper alloy on a surface of a first electroless plating layer which is formed by electroless plating.

In another exemplary embodiment, a plated component includes a first electroless plating layer formed by electroless plating; and a second electroless plating layer made of a copper alloy and formed on a surface of the first electroless plating layer by electroless plating.

In still another exemplary embodiment, a plating system includes a first electroless plating layer forming apparatus configured to form a first electroless plating layer on a surface by electroless plating; and a second electroless plating layer forming apparatus configured to form a second electroless plating layer, which is made of a copper alloy, on a surface of the first electroless plating layer by electroless plating.

Here, the first electroless plating layer may be a barrier layer configured to suppress diffusion of copper.

Further, the first electroless plating layer may be made of cobalt or a cobalt alloy.

Furthermore, the second electroless plating layer may be made of an alloy of copper and nickel.

Moreover, the second electroless plating layer may be a seed layer for forming an electrolytic plating layer of copper on a surface thereof.

According to the exemplary embodiments, it is possible to suppress the peeling between the plating layers formed by the electroless plating. Thus, the reliability of the plating process and the reliability of the component manufactured through the plating process can be improved.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 4A to FIG. 4E are diagrams for describing a plated component.

DETAILED DESCRIPTION

Hereinafter, details of a plating method, a plated component and a plating system according to exemplary embodiments will be described with reference to the accompanying drawings, which form a part of the description. Specifically, in the following description, a silicon substrate is used as a component to be plated, and a plating method of forming a silicon-through electrode in the silicon substrate is explained with reference to a plating system.

Figure 1:
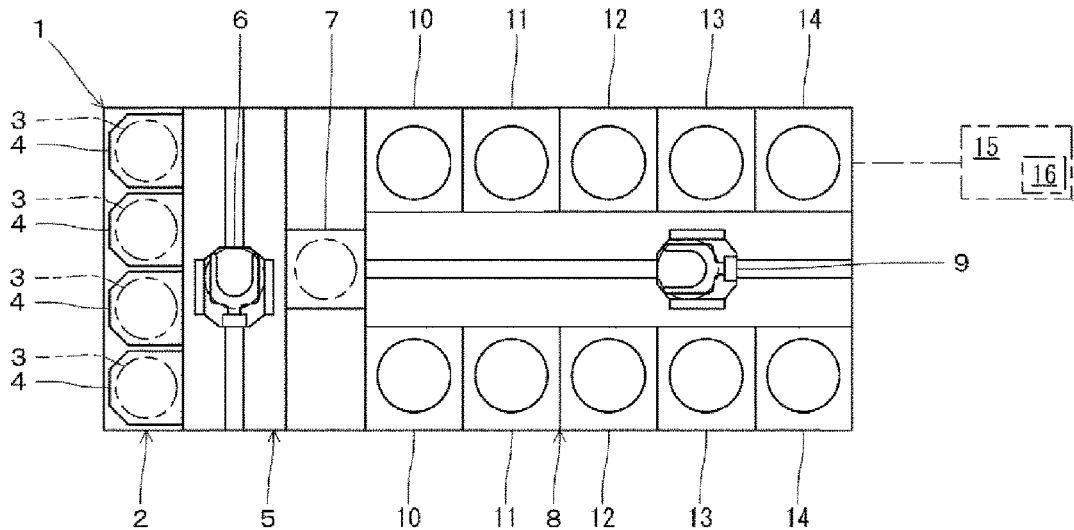
FIG. 1 is a plan view illustrating a plating system.

As depicted in FIG. 1, a plating system 1 is equipped with a carry-in/out block 2 at a front end thereof. Carriers 4, each of which accommodates therein a multiple number (for example, 25 sheets) of substrates 3 (here, semiconductor wafers), are carried into or out of the carry-in/out block 2. In the carry-in/out block 2, the carriers 4 are mounted side by side in a left-and-right direction.

Further, the plating system 1 includes a transfer block 5 at the rear side of the carry-in/out block 2. The transfer block 5 includes a substrate transfer device 6 at a front side thereof and a substrate transit table 7 at a rear side thereof. In this transfer block 5, the substrate 3 is transferred between one of the carriers 4 mounted in the carry-in/out block 2 and the substrate transit table 7 by using the substrate transfer device 6.

Further, the plating system 1 is also equipped with a processing block 8 at the rear side of the transfer block 5. A substrate transfer device 9 extended in a front-rear direction is provided at a center of the processing block 8, and an adhesion layer forming apparatus 10, a catalyst layer forming apparatus 11, a first electroless plating layer forming apparatus 12, a second electroless plating layer forming apparatus 13, an electrolytic plating layer forming apparatus 14 are arranged at both sides of the substrate transfer device 9. In this processing block 8, the substrate 3 is transferred between the substrate transit table 7 and each of the apparatuses 10 to 14 by using the substrate transfer device 9, and various processes are performed on the substrate 3 in the apparatuses 10 to 14.

This plating system 1 has a control unit 15 (computer) and is controlled according to various programs stored on a recording medium 16 provided in the control unit 15. The recording medium 16 stores thereon various kinds of setup data or programs. The recording medium 16 is implemented by, but not limited to, a memory such as a ROM or a RAM, or a disk-type recording medium such as a hard disk, a CO-ROM, a DVD-ROM or a flexible disk, as commonly known in the art.

In the plating system 1, the adhesion layer forming apparatus 10 is configured to form an adhesion layer made of a coupling agent on a surface of the substrate 3. The catalyst layer forming apparatus 11 is configured to form a catalyst layer made of a catalyst on a surface of the adhesion layer. The first electroless plating layer forming apparatus 12 is configured to form a barrier layer (first electroless plating layer) on a surface of the catalyst layer by electroless plating. The second electroless plating layer forming apparatus 13 is configured to form a seed layer (second electroless plating layer) on a surface of the barrier layer by electroless plating. The electrolytic plating layer forming apparatus 14 is configured to form a buried layer (electrolytic plating layer) on a surface of the seed layer by electrolytic plating. These apparatuses 10 to 14 may be implemented by those commonly known in the art.

Figure 2:
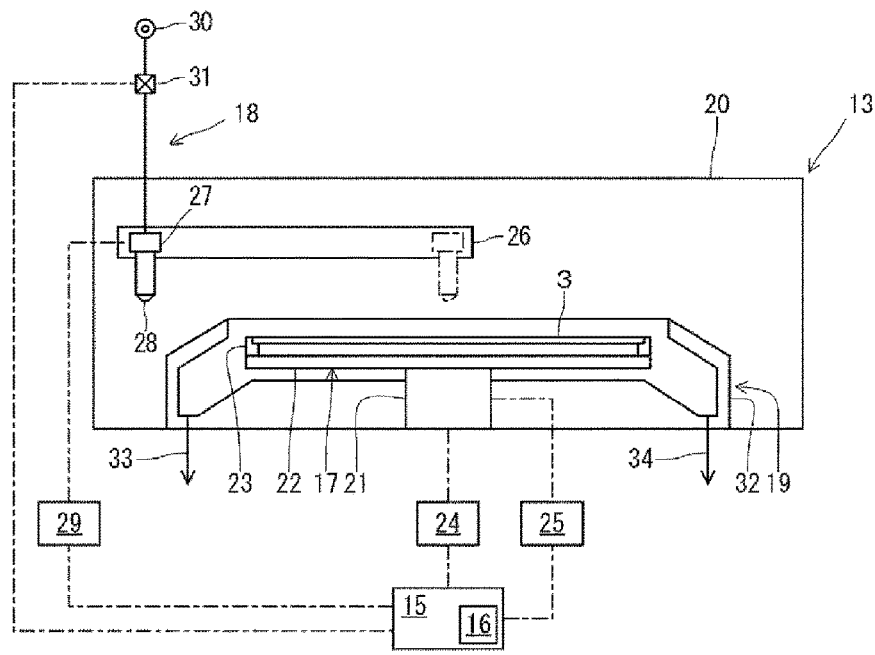
FIG. 2 is a front view illustrating a plating apparatus.
Figure 3:
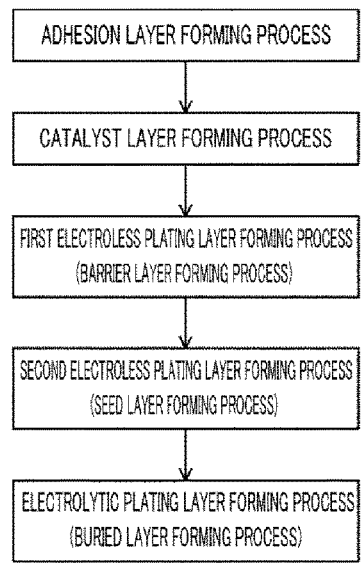
FIG. 3 is a diagram for describing a plating method.
Figure 3:
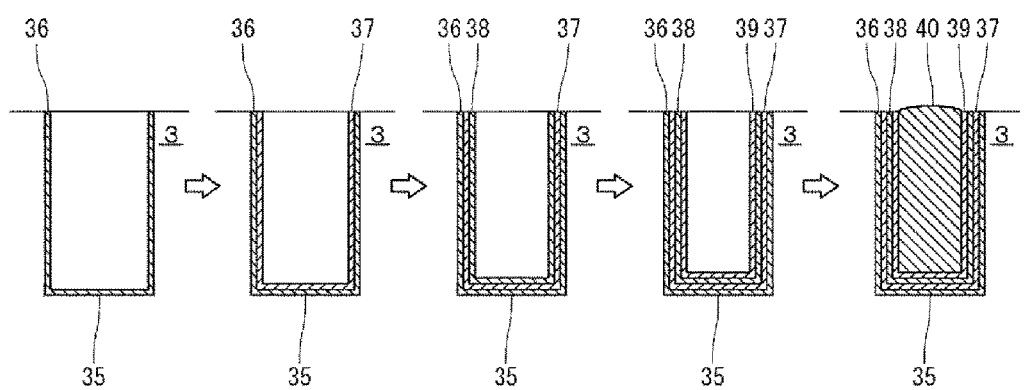

The first electroless plating layer forming apparatus 12 and the second electroless plating layer forming apparatus 13 may have the same configuration except that different kinds of plating liquids are used. By way of example, the first electroless plating layer forming apparatus 12 and the second electroless plating layer forming apparatus 13 may be implemented by a plating apparatus having a configuration shown in FIG. 2. The following description is provided for the second electroless plating layer forming apparatus 13.

The second electroless plating layer forming apparatus 13 includes a substrate holding unit 17, a processing liquid supplying unit 18 and a processing liquid recovering unit 19 which are controlled by the control unit 15. Here, the substrate holding unit 17 is configured to hold and rotate the substrate 3. The processing liquid supplying unit 18 is configured to supply various kinds of processing liquids (cleaning liquid, plating liquid, rinsing liquid, drying liquid, etc.) onto the substrate 3. The processing liquid recovering unit 19 is configured to collect the various kinds of processing liquids supplied to the substrate 3.

The substrate holding unit 17 is equipped with a vertically elongated rotation shaft 21 which is rotatably provided at a substantially central portion within a processing chamber 20. A circular plate-shaped turntable 22 is horizontally provided on an upper end of the rotation shaft 21. A multiple number of substrate holders 23 are arranged on an edge portion of the turntable 22 at a regular interval along the circumference of the turntable 22.

Further, the substrate holding unit 17 also includes a substrate rotating device 24 and a substrate elevating device 25 which are connected to the rotation shaft 21. Rotation by the substrate rotating device 24 and vertical movement by the substrate elevating device 25 are controlled by the control unit 15.

The substrate holding unit 17 is configured to hold the substrate 3 thereon horizontally with the substrate holders 23 of the turntable 22. Further, the substrate holding unit 17 is configured to rotate the substrate 3 held on the turntable 22 by driving the substrate rotating device 24. Furthermore, the substrate holding unit 17 is also configured to move the turntable 22 and the substrate 3 up and down by driving the substrate elevating device 25.

The processing liquid supplying unit 18 includes a guide rail 26 provided within the processing chamber 20; and an arm 27 movably provided to the guide rail 26. A nozzle 28 is provided at a lower portion of a leading end of the arm 27, facing downwards. The arm 27 is connected with a nozzle moving device 29 which is controlled by the control unit 15.

The processing liquid supplying unit 18 also includes a processing liquid supply source 30 which is connected to the nozzle 28 via a flow rate controller 31. A flow rate and an opening/closing operation of the flow rate controller 31 are controlled by the control unit 15. Further, the nozzle 28 is configured to discharge processing liquids toward the substrate 3. The nozzle 28 may have different discharge openings for different kinds of processing liquids, or may have a single discharge opening regardless of the different kinds of the processing liquids. The processing liquid supply source 30 is configured to supply multiple kinds of processing liquids such as a cleaning liquid and a plating liquid selectively. The flow rate controller 31 is configured to control a flow rate of each processing liquid.

The processing liquid recovering unit 19 includes a circular ring-shaped recovery cup 32 provided around the turntable 22. The recovery cup 32 has an opening at a top end thereof, and this opening has a size larger than the turntable 22 (substrate 3). Furthermore, a liquid drain 33 and a gas drain 34 are connected to bottom portions of the recovery cup 32. Here, the recovery cup 32 may be configured to communicate with multiple liquid drains 33 each corresponding to the different kinds of processing liquids individually.

The plating system 1 is configured as described above. In the above-described plating system 1, the apparatuses 10 to 14 are accommodated in a single housing. However, each of the apparatuses 10 to 14 may be accommodated in an individual housing, or the apparatuses 10 to 14 may be accommodated in different housings in several combinations. Further, in the above-described plating system 1, the first electroless plating layer forming apparatus 12 and the second electroless plating layer forming apparatus 13 are separately provided. However, a single plating layer forming apparatus may be used in common.

In the plating system 1 having the above-described configuration, a plating process is performed on the substrate 3 as follows (see FIG. 3 and FIG. 4A to FIG. 4E). Here, the substrate 3 processed within the plating system 1 is provided with a recess 35 which is formed in advance, by using a known method, at a position of the substrate 3 where a silicon-through electrode is to be formed.

In the plating system 1, the substrate 3 having the recess 35 is transferred into the adhesion layer forming apparatus 10, and an adhesion layer 36 is formed on a surface of the recess 35 of the substrate 3 in the adhesion layer forming apparatus 10 (adhesion layer forming process). In the adhesion layer forming apparatus 10, by adsorbing a coupling agent such as a silane coupling agent onto the surface of the recess 35, the adhesion layer 36 formed of a SAM (Self Assembled Monolayer) of the coupling agent is formed on the surface of the recess 35, as illustrated in FIG. 4A. By forming this adhesion layer 36, it is possible to improve adhesivity of a catalyst layer 37 which will be formed afterwards.

Then, in the plating system 1, the substrate 3 having the adhesion layer 36 formed thereon is transferred into the catalyst layer forming apparatus 11, and the catalyst layer 37 is formed on a surface of the adhesion layer 36 in the catalyst layer forming apparatus 11 (catalyst layer forming process). In the catalyst layer forming apparatus 11, by adsorbing a catalyst metal such as palladium of nanoparticle onto the surface of the adhesion layer 36, the catalyst layer 37 formed of the catalyst metal film is formed, as depicted in FIG. 4B. By forming this catalyst layer 37, formation of a first electroless plating layer 38 which will be formed afterwards can be accelerated.

Subsequently, in the plating system 1, the substrate 3 having the catalyst layer 37 formed thereon is sent into the first electroless plating layer forming apparatus 12, and the first electroless plating layer 38 is formed on a surface of the catalyst layer 37 in the first electroless plating layer forming apparatus 12 (first electroless plating layer forming process). In the first electroless plating layer forming apparatus 12, by performing an electroless plating process with a plating liquid containing cobalt/tungsten/boron (Co—W—B), the first electroless plating layer 38 formed of a film made of the cobalt/tungsten/boron is formed on the surface of the catalyst layer 37, as shown in FIG. 4C. By forming this first electroless plating layer 38, it is possible to suppress diffusion of copper contained in a second electroless plating layer 39 which will be formed subsequently. As such, the first electroless plating layer 38 serves as a barrier layer.

Subsequently, in the plating system, the substrate 3 having the first electroless plating layer 38 is sent into the second electroless plating layer forming apparatus 13, and the second electroless plating layer 39 is formed on a surface of the first electroless plating layer 38 in the second electroless plating layer forming apparatus 13 (second electroless plating layer forming process). In the second electroless plating layer forming apparatus 13, by performing an electroless plating process with a plating liquid containing copper and nickel, the second electroless plating layer 39 formed of a film made of an alloy of the copper and the nickel is formed on the surface of the first electroless plating layer 38, as depicted in FIG. 4D. By forming the second electroless plating layer 39 made of the copper alloy, a subsequent process of forming an electrolytic plating layer 40 of copper can be efficiently performed. As such, the second electroless plating layer 39 serves as a seed layer.

Thereafter, in the plating system 1, the substrate 3 having the second electroless plating layer 39 formed thereon is sent into the electrolytic plating layer forming apparatus 14, and the electrolytic plating layer 40 is formed on a surface of the second electroless plating layer 39 in the electrolytic plating layer forming apparatus 14. As a result, the recess 35 formed in the substrate 3 is filled with the electrolytic plating layer 40 (electrolytic plating layer forming process). In the electrolytic plating layer forming apparatus 14, by performing an electrolytic plating process with a plating liquid containing copper, the electrolytic plating layer 40 made of the copper is formed on the surface of the second electroless plating layer 39, as shown in FIG. 4E. Through these processes, the silicon-through electrode can be formed in the substrate 3.

As stated above, in the above-described plating system 1, by forming, through the electroless plating, the second electroless plating layer 39 made of the alloy of the copper and the nickel on the surface of the first electroless plating layer 38 which is formed by the electroless plating, the component processed by plating (i.e., a plated component, here, the substrate 3) is manufactured A peeling test is conducted on the manufactured component with an adhesive tape, and there is observed no phenomenon that the silicon-through electrode is peeled off from the substrate 3. Further, in the manufacturing process of the component (particularly, in the second electroless plating layer forming process), the peeling of the first electroless plating layer 38 or the like is not observed. The reason for this is deemed to be as follows. Conventionally, the second electroless plating layer (seed layer) formed on the surface of the first electroless plating layer (barrier layer) is made of a single metal film of copper. Thus, it is deemed that a stress (film stress) within the second electroless plating layer is high and the adhesivity between the first electroless plating layer and the second electroless plating layer is deteriorated, so that the peeling between the first electroless plating layer and the second electroless plating layer occurs. In contrast, according to the exemplary embodiment, the second electroless plating layer 39 formed on the surface of the first electroless plating layer 38 is not made of the single metal film of copper, but is made of the alloy of the copper and the nickel (copper alloy). Thus, it is deemed that the stress (film stress) within the second electroless plating layer 39 is reduced, and the adhesivity between the first electroless plating layer 38 and the second electroless plating layer 39 is enhanced, so that the peeling does not occur between the first electroless plating layer 38 and the second electroless plating layer 39. Furthermore, it is also deemed that the second electroless plating layer 39 made of the copper alloy serves as a buffer layer after the electrolytic plating layer 40 is formed on the surface of the second electroless plating layer 39, so that the peeling between the plating layers is suppressed. In addition, in forming the second electroless plating layer 39, by discharging the plating liquid containing the copper and the nickel on the first electroless plating layer 38 made of the cobalt/tungsten/boron, it is expected that the first electroless plating layer 38 is suppressed from being eroded by copper.

As explained above, in the above-described plating system 1 (the plating method performed in the plating system 1, and the plated component manufactured in the plating system 1), the second electroless plating layer 39 made of the copper alloy is formed, through the electroless plating, on the surface of the first electroless plating layer 38 which is formed by the electroless plating as well. Accordingly, the peeling between the plating layers (first electroless plating layer 38 and the second electroless plating layer 39) formed by the electroless plating can be suppressed. As a result, the reliability of the plating process and the reliability of the component manufactured through the plating process can be improved.

Further, the above description has been provided for the case of forming the silicon-through electrode in the substrate 3. However, the exemplary embodiment is not limited thereto and may be also applicable to, by way of example, a process of forming a protrusion-shaped electrode (bump) on a semiconductor component or the like. Furthermore, the above-described processes of forming the adhesion layer 36, the catalyst layer 37 or the electrolytic plating layer 40 are nothing more than an example, and are not particularly limited. Further, materials used to form these layers may also be appropriately selected. Though there is no particular limitation in selecting a material of the first electroless plating layer 38, it may be desirable to use a material containing cobalt or a cobalt alloy to allow the first electroless plating layer 38 to have a function as the barrier layer. In addition, the second electroless plating layer 39 is not limited to the alloy of the copper and the nickel, and any copper alloy that make an internal film stress smaller than the single metal layer of copper can be used.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

We claim:

1. A plating method, comprising:
   forming a recess at a position of a substrate where a silicon-through electrode is to be formed;
   forming, by performing a first electroless plating, a first electroless plating layer made of cobalt or a cobalt alloy on a surface of the recess, said first electroless plating being performed only once to form the first electroless plating layer; and
   forming, by performing a second electroless plating, a second electroless plating layer made of an alloy of a copper and a nickel on an upper surface of the first electroless plating layer such that the first electroless plating layer is suppressed from being eroded by a copper and an adhesivity between the first electroless plating layer and the second electroless plating layer is enhanced; and
   forming an electrolytic plating layer made of a copper on a surface of the second electroless plating layer,
   wherein after the electrolytic plating layer is formed on the surface of the second electroless plating, the second electroless plating layer serves as a buffer layer.

2. The plating method of claim 1,
   wherein the first electroless plating layer is a barrier layer configured to suppress diffusion of copper.

3. The plating method of claim 1,
   wherein the second electroless plating layer is a seed layer for forming an electrolytic plating layer of copper on a surface thereof.

4. A plated component, comprising:
   a recess formed at a position of a substrate where a silicon-through electrode is to be formed;
   a first electroless plating layer made of cobalt or a cobalt alloy formed on a surface of the recess formed by performing a first electroless plating, said first electroless plating being performed only once to form the first electroless plating layer;
   a second electroless plating layer made of an alloy of a copper and a nickel and formed on an upper surface of the first electroless plating layer by performing a second electroless plating such that the first electroless plating layer is suppressed from being eroded by a copper and an adhesivity between the first electroless plating layer and the second electroless plating layer is enhanced; and
   an electrolytic plating layer made of a copper and formed on a surface of the second electroless plating layer,
   wherein after the electrolytic plating layer is formed on the surface of the second electroless plating, the second electroless plating layer serves as a buffer layer.

5. The plated component of claim 4,
   wherein the first electroless plating layer is a barrier layer configured to suppress diffusion of copper.

6. The plated component of claim 4,
   wherein the second electroless plating layer is a seed layer for forming an electrolytic plating layer of copper on a surface thereof.

7. A plating system, comprising:
   a recess forming apparatus configured to form a recess at a position of a substrate where a silicon-through electrode is to be formed;
   a first electroless plating layer forming apparatus configured to form a first electroless plating layer made of cobalt or a cobalt alloy on a surface of the recess by performing a first electroless plating, said first electroless plating being performed only once to form the first electroless plating layer;
   a second electroless plating layer forming apparatus configured to form a second electroless plating layer, which is made of an alloy of a copper and a nickel, on an upper surface of the first electroless plating layer by performing a second electroless plating such that the first electroless plating layer is suppressed from being eroded by a copper and an adhesivity between the first electroless plating layer and the second electroless plating layer is enhanced; and
   an electrolytic plating layer forming apparatus configured to form an electrolytic plating layer made of a copper on a surface of the second electroless plating layer,
   wherein after the electrolytic plating layer is formed on the surface of the second electroless plating, the second electroless plating layer serves as a buffer layer.

* * * * *